United States Patent
Hämäläinen et al.

(10) Patent No.: US 6,578,172 B1
(45) Date of Patent: Jun. 10, 2003

(54) METHOD AND ARRANGEMENT FOR IMPLEMENTING CONVOLUTIONAL DECODING

(75) Inventors: Ari H. Hämäläinen, Linnoituskuja (FI); Jukka A. Henriksson, Kurkijoentie (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/573,693

(22) Filed: May 19, 2000

(30) Foreign Application Priority Data

May 21, 1999 (FI) .................................................. 991159

(51) Int. Cl.[7] .............................................. H03M 13/03
(52) U.S. Cl. ........................................ 714/786; 714/787
(58) Field of Search .......................... 375/343; 341/51; 714/759, 786, 787; 706/41, 17, 16, 38, 26

(56) References Cited

U.S. PATENT DOCUMENTS

| | | | |
|---|---|---|---|
| 4,885,757 A | * 12/1989 | Provence ..................... | 375/343 |
| 5,134,396 A | * 7/1992 | Sirat et al. ..................... | 341/51 |
| 5,166,938 A | * 11/1992 | Chung ......................... | 714/759 |
| 5,168,551 A | * 12/1992 | Jeong .......................... | 706/41 |
| 5,268,684 A | * 12/1993 | Allen et al. ................... | 341/75 |
| 5,293,453 A | * 3/1994 | Frazier ........................ | 706/17 |
| 5,548,684 A | * 8/1996 | Wang et al. ................... | 706/16 |
| 5,632,006 A | * 5/1997 | Peterson et al. ............... | 706/38 |
| 5,764,858 A | * 6/1998 | Sheu et al. .................... | 706/26 |

OTHER PUBLICATIONS

"Digital Communication", J.G. Proakis, 3rd Edition, pp 500–506.

* cited by examiner

*Primary Examiner*—David Ton
(74) *Attorney, Agent, or Firm*—Perman & Green, LLP

(57) ABSTRACT

The invention relates to a method and arrangement for advantageously decoding and channel correcting a convolutionally encoded signal received over a transmission path. The signal comprises code words and the arrangement comprises a neural network comprising a set of neurons which comprise a set of inputs and an output. The received code words (400) and at least some of the output signals (402) of the neural network neurons are connected to the inputs of the neurons, and the neurons comprise means (404) for multiplying at least some of the neuron inputs prior to combining means (406). The arrangement also comprises means (123) for estimating the transmission channel. Further, estimated channel data (400) is connected to the inputs of the neurons and a predetermined neuron is arranged to give an estimate of the channel-corrected and decoded symbol in its output signal.

20 Claims, 7 Drawing Sheets

METHOD AND ARRANGEMENT FOR IMPLEMENTING CONVOLUTIONAL DECODING

FIELD OF THE INVENTION

The invention relates to a method and an arrangement for decoding and channel correcting a convolutionally encoded signal in a receiver, by means of a feedback neural network, said signal being received over a transmission path.

BACKGROUND OF THE INVENTION

In telecommunication connections, the transmission path used for transmitting signals is known to cause interference to telecommunication. This occurs regardless of the physical form of the transmission path, i.e. whether the transmission path is a radio link, an optical fibre or a copper cable. Particularly in telecommunications over a radio path there are frequently situations where the quality of the transmission path varies from one occasion to another and also during a connection.

Radio path fading is a typical phenomenon that causes changes in a transmission channel. Other simultaneous connections may also cause interferences and they can vary as a function of time and place.

In a typical radio telecommunication environment the signals between a transmitter and a receiver propagate on a plurality of routes. This multipath propagation mainly results from signal reflections from surrounding surfaces. The signals that propagated via different routes reach the receiver at different times due to different transit delays. Various methods have been developed in order to compensate the interference caused by this multipath propagation.

In order to reduce the effects of interference caused by the transmission path, a digital signal is encoded so as to make the transmission connection more reliable. Thus the errors caused by the interference in the transmitted signal can be detected and, depending on the encoding method used, also corrected without retransmission. Conventional encoding methods used in digital telecommunication include, for instance, block coding and convolutional coding. In block coding the bits to be encoded are grouped into blocks at the end of which are added parity bits, by means of which the correctness of the bits of the preceding block can be checked.

In the receiver, the errors caused by multipath propagation are typically first corrected, for instance, by a linear transversal corrector and thereafter the convolutional code is decoded.

The efficiency of convolutional coding depends on the code rate and constraint length used. A large constraint length enables good error correction capability, but on the other hand, decoding by known methods is then very complicated.

In general, convolutional coding is decoded by using a Viterbi algorithm that has nearly optimal performance. However, the Viterbi algorithm has a drawback that its complexity increases exponentially as the constraint length increases. This restricts the constraint lengths available.

Another known decoding method is sequential decoding that is described in greater detail in *Digital Communications*, J. G. Proakis, 3rd edition, pp. 500–503. One drawback of this algorithm is that the decoding delay does not remain constant but varies.

Yet another known decoding method is a so-called stack algorithm that is described in greater detail in the above-mentioned publication *Digital Communications*, J. G. Proakis, 3rd edition, pp. 503–506. The performance of this algorithm is not so good as that of the Viterbi algorithm.

Of the known methods, the Viterbi algorithm has the best performance for decoding the convolutional code, but its implementation has turned out to be extremely difficult in practice as the constraint length increases. The difficult implementation of the complicated Viterbi algorithm by circuitry has restricted the constraint lengths available for use.

A separate channel corrector and decoder are a suboptimal solution. Use of channel data, in particular within the Viterbi algorithm when computing the metrics, leads to increased complexity and the implementation of practical applications is impossible.

BRIEF DESCRIPTION OF THE INVENTION

The object of the invention is to provide a method and an arrangement implementing the method such that the above-mentioned drawbacks can be solved. This is achieved by a method of the invention for decoding a convolutionally encoded signal received over a transmission path, which signal comprises code words and in which method a transmission channel is estimated, decoding is carried out by means of an artificial neural network, the neural network comprising a set of neurons which comprise a set of inputs and an output, the received code word set is conducted to the inputs of the neuron, at least some of the inputs of the neuron are multiplied, after multiplication some of the inputs of the neuron are combined, some of the output signals of the neural network neurons are fed back to the inputs of each neuron, initial values of the neurons are set and the network is allowed to stabilize.

Further, in the method of the invention the multiplication of the neuron inputs depends on the convolutional code used in signal encoding and on the estimated channel and on the fact that an estimate of the decoded and channel-corrected symbol is conducted from the output signal of a predetermined neuron to the output of the network after the network has reached a stabilized state, the set of code words in the shift register is updated and the above-described four last steps are repeated until the desired number of code words are decoded.

The invention also relates to an arrangement for decoding and channel correcting a convolutionally encoded signal received over a transmission path, the signal comprising code words and the arrangement comprising a neural network which comprises a set of neurons which comprise a set of inputs and an output, the received code words being applied to the inputs of said neurons and to at least some of the output signals of the neural network neurons, the neurons comprising means for multiplying at least some of the inputs of the neuron prior to combining means, the arrangement comprising means for estimating the transmission channel. Further in the arrangement of the invention, estimated channel data is applied to the inputs of the neurons, and a predetermined neuron is arranged to give an estimate of the channel-corrected and decoded symbol in its output signal.

The preferred embodiments of the invention are disclosed in the dependent claims.

In the solution of the invention, convolutional code decoding and channel correction are performed by means of a feedback neural network. Several advantages are achieved with the solution of the invention. Performance that is close to that of the Viterbi algorithm is achieved with the solution of the invention by means of considerably simpler circuitry.

In the solution of the invention, equally complicated circuitry permits a larger constraint length and thus improved error correction over the Viterbi algorithm.

The neural network of the invention can be readily constructed by semiconductor technology, since the neurons of the neural network are very similar to one another in structure, only the input couplings vary. Consequently, to design and implement even a large network does not involve a great amount of work. The solution can also be advantageously implemented as a VLSI circuit, which makes it fast.

BRIEF DESCRIPTION OF THE DRAWINGS

In the following the invention will be described in greater detail in connection with preferred embodiments with reference to the accompanying drawings, wherein.

DETAILED DESCRIPTION OF THE INVENTION

The solution of the invention can be applied in any digital data transmission system where a signal to be transmitted is encoded by convolutional coding. Examples of possible systems include cellular radio systems, radio links, wired networks or optical networks.

Figure 1:
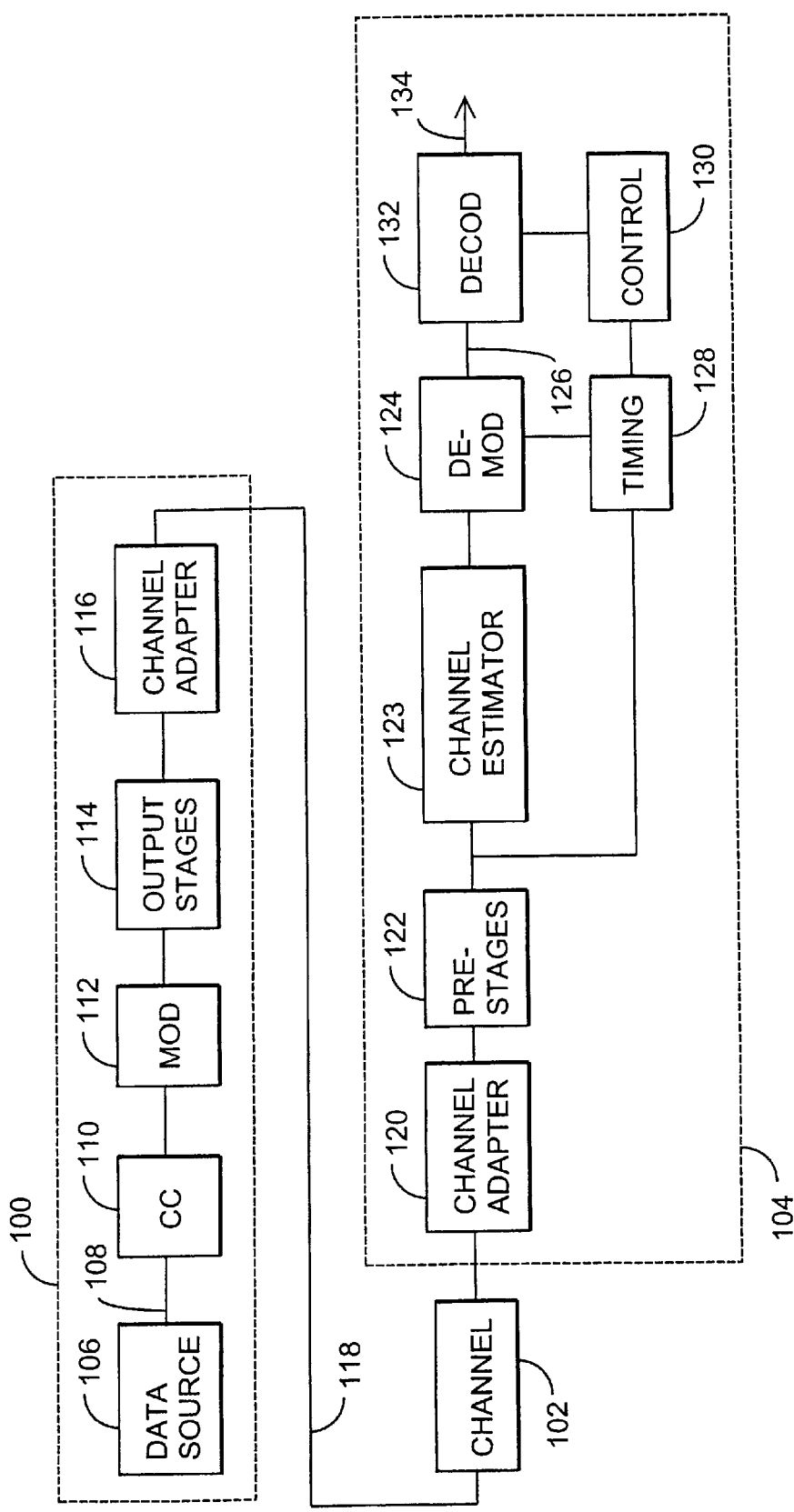
FIG. 1 illustrates an example of a telecommunications system where the solution of the invention can be applied.

FIG. 1 illustrates an example of a telecommunications system according to the invention. The figure shows a transmitter 100, a signal transmission path 102 and a receiver 104. The operations of the invention are implemented in the receiver. The signal transmission path can be a radio path, a copper cable or an optical fibre, for instance.

In the transmitter, a data source 106 generates a signal 108 composed of bits. An error correcting code can be added to the data source signal 108 by a known FEC (Forward Error Correcting) method, if necessary. This is not shown in the figure. The signal 108 is applied to an encoder 110 where convolutional coding is effected with desired parameters (constraint length and code rate). The encoder can have a prior art structure. The encoded signal can be understood as code words whose length depends on the code used. The encoded signal is applied to a modulator 112 where the desired modulation is performed. The modulated signal is further applied to output stages 114 and a channel adapter 116 of the transmitter which are system-dependent components. The output stage 114 can be a radio frequency amplifier and a filter, for instance. The channel adapter 116 can be an antenna or an electrical/opto-converter, for instance.

A transmitter output signal 118 propagates through the transmission path 102, i.e. the channel, to the receiver 104. The receiver comprises a channel adapter 120 and a receiver pre-stage 122 which are system-dependent components. The output stage 122 can comprise a radio frequency amplifier and a filter, for instance. The channel adapter 120 can comprise an antenna or an opto/electrical converter, for instance. The signal is applied from the pre-stage 122 further to a channel estimator 123 where channel estimation is performed by using known methods. From the channel estimator, the signal is applied to a demodulator 124 from which is typically received a baseband bit stream 126 which can be complex and comprise separate I- and Q-branch bits. Timing information is derived from the received signal in a regenerator 128 by a known method. This timing information is used in demodulation. The receiver further comprises a control unit 130 which can be advantageously implemented by a processor. The control unit 130 controls the operation of the receiver. Information on the timing is also applied to the control unit.

The signal 126 coming from the demodulator 124 thus comprises the demodulated bits which can be presented as code words. The code words are applied to a decoder 132 which is implemented by a neural network in the receiver of the invention. Convolutional coding is decoded in the decoder and the decoder output signal 134 corresponds to the original signal 108. In connection with convolutional coding, the channel data obtained from the channel estimator 123 is taken into account, i.e. channel correction is performed. If an error correcting code was used in the transmitter, it is decoded at this stage. This is not shown in the figure.

The method for decoding the convolutional code and performing the channel correction in accordance with the invention is studied next in greater detail. It is assumed in this example that 4 QAM modulation is used. Generally, the aim of the decoding is to find a bit sequence B that minimizes the function $$\min_{B} \sum_{s=0}^{T} \|r(t+sdt) - h\gamma_c(B(t+sdt))\|^2 =: \min_{B} f(B) \tag{1}$$

where r(t+sdt) is a received code word at a time instant t+sdt,
dt is a symbol interval,
h=[$h_1$, $h_2$] are channel coefficients of a two-path channel,
$\gamma_c$ (B(t+sdt))=[γ(B(t+sdt)), γ(B(t+(s−1)dt)) a vector with a current code word and a preceding code word as components. When 4 QAM modulation is used, these are complex values.

For the sake of clarity, r(s)=r(t+sdt) and B(s)=B(t+sdt) are used. Furthermore, instead of bit values 0 and 1, values −1 and 1 are used. In Formula (1)

$B(s)=[b(s-L+1), \ldots, b(s)]$, $b \in \{1,-1\}$, b(−L+1), . . . , b(0) are fixed, L is the constraint length and T is the decoding delay. The encoder function γ corresponds to the generation matrix G of a convolutional encoder. On the transmission path, interference, such as noise, appears in the signal. A noisy code word received at a time instant s is indicated by r(s). It is assumed that the noise is white Gaussian noise.

Let us study here the generation of a neural network of the invention by means of an example employing a convolutional code with code rate ½ and constraint length L=3. The generation matrix G for such a code is $$G = \begin{bmatrix} 1 & 0 & 1 \\ 1 & 1 & 1 \end{bmatrix}.$$

The encoder for the convolutional code with code rate ½ and constraint length L can be written as a complex function $$\gamma(B(s)) = \gamma_1(B(s)) + i\gamma_2(B(s)),$$

where $$\gamma_j(B(s)) = \prod_{i=1}^{L}(b(s+1-i))^{g_{ij}}(-1)(-1)^{g_{js}},$$

and $g_{j,i}$s are the elements of the matrix G. Now, as in this example L=3, the encoder is of the form $$\gamma(B(s)) = -b(s)b(s-2) + ib(s)b(s-1)b(s-2)$$

and the received noisy complex code word is $r(s) = r_1(s) + ir_2(s)$.

Equation (1) is written out as:

$$\sum_s \|r(s) - h\gamma_c(B(s))\|^2 = \sum_s \left( \frac{1}{2}[\mathrm{re}(r(s))^2 + \mathrm{im}(r(s))^2] + \right. \tag{2}$$

$$[\mathrm{re}(r(s)h_1^c)b(s)b(s-2) -$$
$$\mathrm{im}(r(s)h_1^c)b(s)b(s-1)b(s-2)] +$$
$$[\mathrm{re}(r(s)h_2^c)b(s-1)b(s-3) -$$
$$\mathrm{im}(r(s)h_2^c)b(s-1)b(s-2)b(s-3)] +$$
$$\frac{1}{2}h_1^c h_1[b(s)^2 b(s-2)^2 +$$
$$b(s)^2 b(s-1)^2 b(s-2)^2] +$$
$$\frac{1}{2}h_2^c h_2[b(s-1)^2 b(s-3)^2 +$$
$$b(s-1)^2 b(s-2)^2 b(s-3)^2] +$$
$$\mathrm{re}(h_1^c h_2)b(s)b(s-1)b(s-2)$$
$$b(s-3) - \mathrm{im}(h_1^c h_2)b(s)b(s-1)$$
$$b(s-2)b(s-3) + \mathrm{im}(h_1^c h_2)b(s)$$
$$b(s-1)b(s-2)^2 b(s-3) + \mathrm{re}(h_1^c h_2)$$
$$\left. b(s)b(s-1)^2 b(s-2)^2 b(s-3) \right).$$

In the above, the superscript c refers to a complex conjugate. As $b(s-1)^2=1$ and $b(s-2)^2=1$, the minima of the above function (2) and the function $$\hat{f}(B) := = \sum_s \left( \frac{1}{2}[\mathrm{re}(r(s))^2 + \mathrm{im}(r(s))^2] + \right. \tag{3}$$

$$[\mathrm{re}(r(s)h_1^c)b(s)b(s-2) - \mathrm{im}(r(s)h_1^c)b(s)b(s-1)$$
$$b(s-2)] + [\mathrm{re}(r(s)h_2^c)b(s-1)b(s-3) - \mathrm{im}(r(s)h_2^c)$$
$$b(s-1)b(s-2)b(s-3)] + \frac{1}{2}h_1^c h_1[b(s)^2 b(s-2)^2 +$$
$$b(s)^2 b(s-1)^2 b(s-2)^2] + \frac{1}{2}h_2^c h_2[b(s-1)^2 b(s-3)^2 +$$
$$b(s-1)^2 b(s-2)^2 b(s-3)^2] + \mathrm{re}(h_1^c h_2)b(s)$$
$$b(s-1)b(s-2)b(s-3) - \mathrm{im}(h_1^c h_2)b(s)b(s-1)$$
$$b(s-2)b(s-3) + \mathrm{im}(h_1^c h_2)b(s)b(s-1)b(s-3) +$$
$$\left. \mathrm{re}(h_1^c h_2)b(s)b(s-3) \right).$$

are the same. The differences between the functions are in the two last terms. To eliminate complicated feedbacks, the function (3) will be employed.

(3) is differentiated with respect to b(k). Then we obtain a partial derivative which is of the form $$\frac{\partial \hat{f}(B)}{\partial b(k)} = \mathrm{re}(r(k)h_1^c)b(k-2) - \mathrm{im}(r(k)h_1^c)b(k-1)b(k-2) - \tag{4}$$

$$\mathrm{im}(r(k+1)h_1^c)b(k+1)b(k-1) +$$
$$\mathrm{re}(r(k+1)h_2^c)b(k-2) -$$
$$\mathrm{im}(r(k+1)h_2^c)b(k-1)b(k-2) +$$
$$\mathrm{re}(r(k+2)h_1^c)b(k+2) -$$
$$\mathrm{im}(r(k+2)h_1^c)b(k+2)b(k+1) -$$
$$\mathrm{im}(r(k+2)h_2^c)b(k+1)b(k-1) +$$
$$\mathrm{re}(r(k+3)h_2^c)b(k+2) -$$
$$\mathrm{im}(r(k+3)h_2^c)b(k+2)b(k+1) + \mathrm{re}(h_1^c h_2)b(k-3) +$$
$$\mathrm{re}(h_1^c h_2)b(k-2)b(k-1)b(k-3) -$$
$$\mathrm{im}(h_1^c h_2)b(k-2)b(k-3) + \mathrm{im}(h_1^c h_2)b(k-1)$$
$$b(k-3) + \mathrm{re}(h_1^c h_2)b(k+1)b(k-1)b(k-2) +$$
$$\mathrm{im}(h_1^c h_2)b(k+1)b(k-2) +$$
$$\mathrm{re}(h_1^c h_2)b(k+2)b(k+1)b(k-1) -$$
$$\mathrm{im}(h_1^c h_2)b(k+2)b(k-1) +$$
$$\mathrm{re}(h_1^c h_2)b(k+3)b(k+2)b(k+1) -$$
$$\mathrm{im}(h_1^c h_2)b(k+3)b(k+1) + \mathrm{im}(h_1^c h_2)b(k+3)$$
$$b(k+2) + \mathrm{re}(h_1^c h_2)b(k+3) + 5(h_1^c h_1 + h_2^c h_2)b(k).$$

Now we use a gradient method $$b(k) = b(k) - \alpha \frac{\partial \hat{f}(B)}{\partial b(k)}.$$

By selecting $$\alpha = \frac{1}{5(h_1^c h_1 + h_2^c h_2)}$$

it is possible to eliminate the feedbacks appearing in the last term of Formula (4). Further by assuming that b(k) obtains values −1 or 1, the following equivalence is true for all the values k=0, . . . , T $b(k) = \mathrm{sign}($ $-\mathrm{re}(r(k)h_1^c)b(k-2) + \mathrm{im}(r(k)h_1^c)b(k-1)b(k-2)$ $+\mathrm{im}(r(k+1)h_1^c)b(k+1)b(k-1) - \mathrm{re}(r(k+1)h_2^c)b(k-2)$ $+\mathrm{im}(r(k+1)h_2^c)b(k-1)b(k-2) - \mathrm{re}(r(k+2)h_1^c)b(k+2)$ $+\mathrm{im}(r(k+2)h_1^c)b(k+2)b(k+1) + \mathrm{im}(r(k+2)h_2^c)b(k+1)b(k-1)$ $-\mathrm{re}(r(k+3)h_2^c)b(k+2) + \mathrm{im}(r(k+3)h_2^c)b(k+2)b(k+1) - \mathrm{re}(h_1^c h_2)b(k-3)$ $-\mathrm{re}(h_1^c h_2)b(k-2)b(k-1)b(k-3) + \mathrm{im}(h_1^c h_2)b(k-2)b(k-3)$ $-\mathrm{im}(h_1^c h_2)b(k-1)b(k-3) - \mathrm{re}(h_1^c h_2)b(k+1)b(k-1)b(k-2)$ $-\mathrm{im}(h_1^c h_2)b(k+1)b(k-2) - \mathrm{re}(h_1^c h_2)b(k+2)b(k+1)b(k-1)$ $+\mathrm{im}(h_1^c h_2)b(k+2)b(k-1) - \mathrm{re}(h_1^c h_2)b(k+3)b(k+2)b(k+1)$ $+\mathrm{im}(h_1^c h_2)b(k+3)b(k+1) - \mathrm{im}(h_1^c h_2)b(k+3)b(k+2) = \mathrm{re}(h_1^c h_2)b(k+3))$ (5)

From the above the following updating rule is obtained: one k at a time is selected and a corresponding bit is updated by using Formula (5) and this is repeated until no changes occur in the bits, i.e. the network is stabilized. It should be noted that if k=T−1, or k=T, then b(T+1)=0 and b(T+2)=0 are set. In the actual implementation, the operation may take place in parallel such that all neurons k are updated simultaneously.

The iteration according to Formula (5) can thus be presented as an artificial neuron of the neural network. By setting $S_k=b(k)$, where $S_k$ is the state of the $k^{th}$ neuron and when re and im are the real and imaginary parts of the external inputs coming to the neuron, the state of the $k^{th}$ neuron can be presented as:

$$S_k=f_a(-re(r(k)h_1^c)S_{k-2}+im(r(k)h_1^c)S_{k-1}S_{k-2}$$

$$+im(r(k+1)h_2^c)S_{k-1}S_{k-2}-re(r(k+2)h_1^c)S_{k+2}$$

$$+im(r(k+1)h_2^c)S_{k-1}S_{k-2}-re(r(k+2)h_1^c)S_{k+2}$$

$$+im(r(k+2)h_1^c)S_{k+2}S_{k+1}+im(r(k+2)h_2^c)S_{k+1}S_{k-1}S_{k-1}$$

$$-re(r(k+3)h_2^c)S_{k+2}+im(r(k+3)h_2^c)S_{k+2}S_{k+1}-re(h_1^c h_2)S_{k-3}$$

$$-re(h_1^c h_2)S_{k-2}S_{k-1}S_{k-3}+im(h_1^c h_2)S_{k-2}S_{k-3}$$

$$-im(h_1^c h_2)S_{k-1}S_{k-3}-re(h_1^c h_2)S_{k+1}S_{k-1}S_{k-2}$$

$$-im(h_1^c h_2)S_{k+1}S_{k-2}-re(h_1^c h_2)S_{k+2}S_{k+1}S_{k-1}$$

$$+im(h_1^c h_2)S_{k+2}S_{k-1}-re(h_1^c h_2)S_{k+3}S_{k+2}S_{k+1}$$

$$+im(h_1^c h_2)S_{k+3}S_{k+1}-im(h_1^c h_2)S_{k+3}S_{k+2}-re(h_1^c h_2)S_{k+3}), \quad (6)$$

where $f_a$ is an activation function, typically a sigmoidal function or a hard limiter. In Formula (5) a signum function $f_a(x)=sign(x)$ is used.

Figure 2:
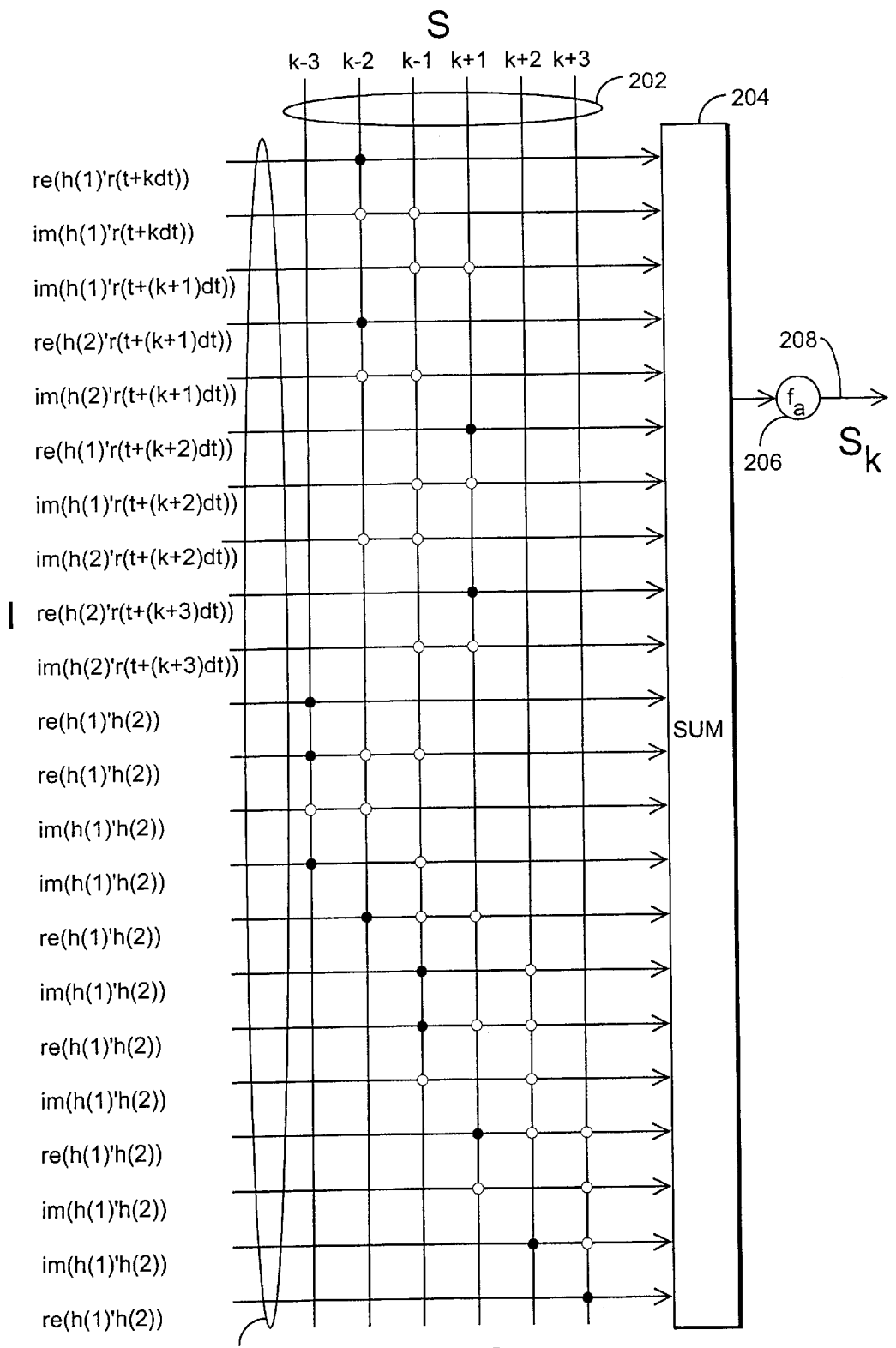
FIG. 2 shows an example of a neuron designed by means of the method of the invention.

FIG. 2 illustrates a neuron according to Formula (6). The state $S_k$ of the neuron appears at the neuron output. According to Formula (6), real and imaginary parts of the products of the received corrupted code words r(t) and channel coefficients $h_1$ and $h_2$ (or their conjugates) as well as real and imaginary parts of the products of channel coefficients $h_1$ and $h_2$ (or their conjugates) are applied to the neuron as an input 200. Since the code rate of the code used was ½, one bit to be encoded results in two bits when encoded. Correspondingly, in decoding one decoded bit represents two bits of the code word. Furthermore, feedback outputs of other neural network neurons, i.e. $S_{k-3}$, $S_{k-2}$, $S_{k-1}$, $S_{k+1}$, $S_{k+2}$, and $S_{k+3}$, are applied to the neuron as an input 202. The output of each neuron thus comprises one decoded bit.

In a preferred embodiment of the invention, the neuron is not fed back to itself, i.e. the value $S_k$ is not applied to the neuron as an input. The inputs of the neuron are multiplied according to Formula (6). This is illustrated by dots at the intersection of the lines. White dots denote the multiplication of the inputs and black dots denote the multiplication of the inputs and the change of the sign of the product. The multiplied signals are summed 204 and applied to an activation function 206 whose output $S_k$ 208 is the output value of the neuron.

The activation function employed can be either a hard-decision or a soft-decision function or a step function. If the result is a hard decision, the neuron outputs can have values −1 or 1. If the result is a soft decision, the neuron output can be a floating point number. Correspondingly, if the demodulator 124 produces soft bit decisions, neuron input 200 comprises floating point numbers, and if the demodulator produces hard bit decisions, the neuron input 200 comprises bits. If both of the neuron inputs comprise bits, the multiplication between the inputs can be implemented in a simple manner by digital technology.

Since the derived neural network is a so-called optimizing neural network, it may be caught in a local minimum. To avoid this, in one preferred embodiment of the invention, noise (AWGN) whose variance reduces during the stabilization stage is added to the incoming signal in the neurons. In that case, Formula (6) is of the form $$S_k=f_a(-re(r(k)h_1^c) S_{k-2}+im(r(k)_1^c)S_{k-1}S_{k-2}$$

$$+im(r(k+1)h_1^c)S_{k+1}S_{k-1}-re(r(k+1)h_2^c)S_{k-2}$$

$$+im(r(k+1)h_2^c)S_{k-1}S_{k-2}-re(r(k+2)h_1^c)S_{k+2}$$

$$+im(r(k+2)h_1^c)S_{k+2}S_{k+}+im(r(k+2)h_2^c)S_{k+1}S_{k-1}$$

$$-re(r(k+3)h_2^c)S_{k+2}+im(r(k+3)h_2^c)S_{k+2}S_{k+1}-re(h_1^c h_2)S_{k-3}$$

$$-re(h_1^c h_2)S_{k-2}S_{k-1}S_{k-3}+im(h_1^c h_2)S_{k-2}S_{k-3}$$

$$-im(h_1^c h_2)S_{k-1}S_{k-3}-re(h_1^c h_2)S_{k+1}S_{k-1}S_{k-2}$$

$$-im(h_1^c h_2)S_{k+1}S_{k-2}-re(h_1^c h_2)S_{k+2}S_{k+1}S_{k-1}$$

$$+im(h_1^c h_2)S_{k+2}S_{k-1}-re(h_1^c h_2)S_{k+3}S_{k+2}S_{k+1}$$

$$+im(h_1^c h_2)S_{k+3}S_{k+1}-im(h_1^c h_2)S_{k+3}S_{k+2}-re(h_1^c h_2)S_{k+3}+AWGN). \quad (7)$$

In decoding, the following steps are generally carried out for each received code word:

1. Setting $S_{-1}$, $S_{-2}$ and $S_{-3}$ according to previous decisions. The products of the real and imaginary parts of the products of the received code words r(t), ..., r(t+Tdt) and the channel coefficients are applied to the neuron inputs 200.
2. Initializing S(i), i=0, ..., T.
3. Updating the neuron k for each k=0, ..., T according to Formula (7).
4. Reducing the variance of the added noise. If the necessary number of iteration rounds have been carried out, the procedure is terminated, otherwise the procedure returns to step 3.

After this, the bit to be decoded is at the output of neuron 0.

Figure 3:
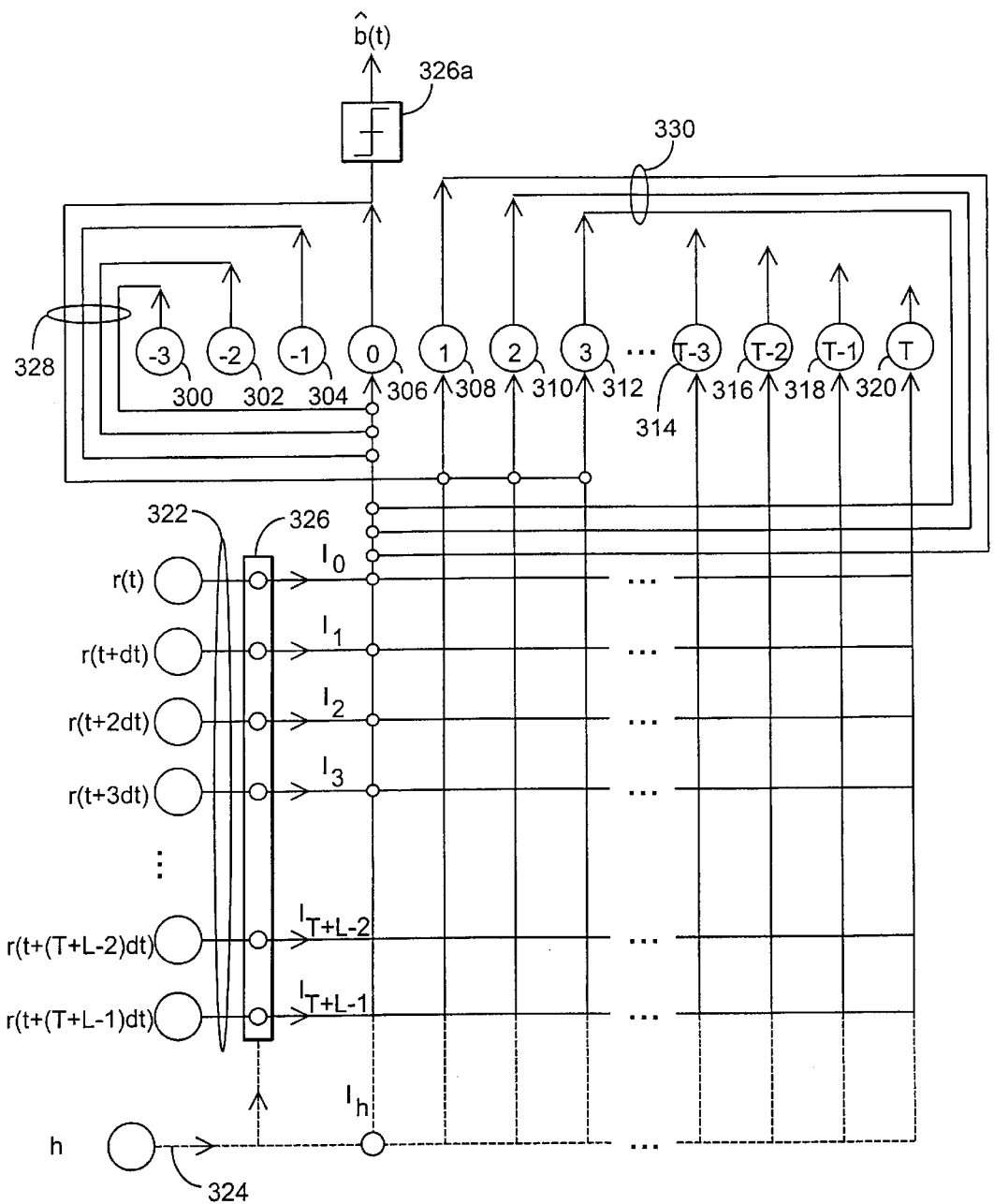
FIG. 3 shows an example of couplings of the neural network neuron designed by means of the method of the invention.

FIG. 3 illustrates couplings of the neural network designed for decoding code rate ½ and constraint length 3. The demodulated code words 322 and the channel data 324 received from the channel estimation means are applied to a single neuron 306 as an input. The code words and the channel data are multiplied according to Formula (6) in a multiplier 326. Further, outputs 328, 330 from the adjacent neurons 300 to 304, 308 to 320 are applied to the neuron 306 as an input. The neuron output is the value of the activation function 326, the value being a decoded symbol. The neural network is initialized such that the previously made bit decisions become the states of the neurons −3, −2 and −1, i.e. 300 to 304. As the states of the neurons 0, ..., T, i.e. 306 to 320, +1 or −1 are set randomly. Thereafter, the network is allowed to stabilize. The decoded bit is the output of the neuron 306, i.e. neuron 0, or if more than one bit is decoded at a time, the outputs of the neurons 0, ..., N.

Duration of the network stabilization can be determined either by allowing the iterations to continue until the bit at the output does not vary or by performing a predetermined number of iteration rounds.

In order to avoid being caught in a local minimum, other methods together with or instead of noise addition can also be used. The number of iteration rounds to be performed can be increased. Another option is to use several parallel neural networks. When each neural network is stabilized, the best bit decision can be selected from the outputs of the networks. The selection can be made by a majority decision, for instance, selecting the bit decision that occurs most frequently at the outputs of the parallel neural networks. It is also possible to re-encode the decoding result and compare the obtained result with the received code word, i.e. to select a result that minimizes the function $$\frac{1}{T_b}\sum_{s=0}^{T_b}\|r(s)-r_{re}(s)\|^2. \qquad (8)$$

Decoding can also be accelerated such that several bit decisions of the adjacent neurons, i.e. neurons $S_0, \ldots, S_N$, are extracted simultaneously from the neural network. When decoding the subsequent bits, the states of the neurons $S_{-L+1}, \ldots, S_{-1}$ have to be initialized to have the preceding values.

The method of the invention can also be applied when the code to be decoded is a punctured code.

The solution of the invention can also be advantageously applied such that fast channel estimates are utilized. Each symbol can be expressed using symbol-specific channel data, even though the convolutional code extends over a plurality of symbols.

Let us study next the complexity of the solution of the invention mainly from the viewpoint of implementation. When the constraint length L increases, more neurons are needed in the neural network and the duration of stabilization increases, and consequently the number of multiplications increases. It is known that the complexity of a Viterbi decoder increases exponentially as the constraint length L increases. However, the complexity of the decoder implemented by means of the neural network of the invention increases much more slowly. When the constraint length is L and the number of channel taps is H, each neuron of the neural network is coupled to L+H−2 preceding and L+H−2 subsequent neurons and to L inputs. If it is assumed that the decoding delay is 5L, as it generally is, the decoder requires 5L neurons and thus the maximum number of connections is in the order of $O(H^2L^2n)$, where n is the number of generators.

The number of multiplications to be performed in one neuron depends on the code generator used, but it is $\leq O(nH^3+nH^2L+nHL^2)$. Thus, during one iteration round, when each neuron is updated once, the number of multiplications to be performed is $O(nLH^3+nH^2L^2+nHL^3)$. This shows how the complexity in the solution of the invention increases considerably more slowly than in connection with the Viterbi algorithm as L increases.

Figure 4:
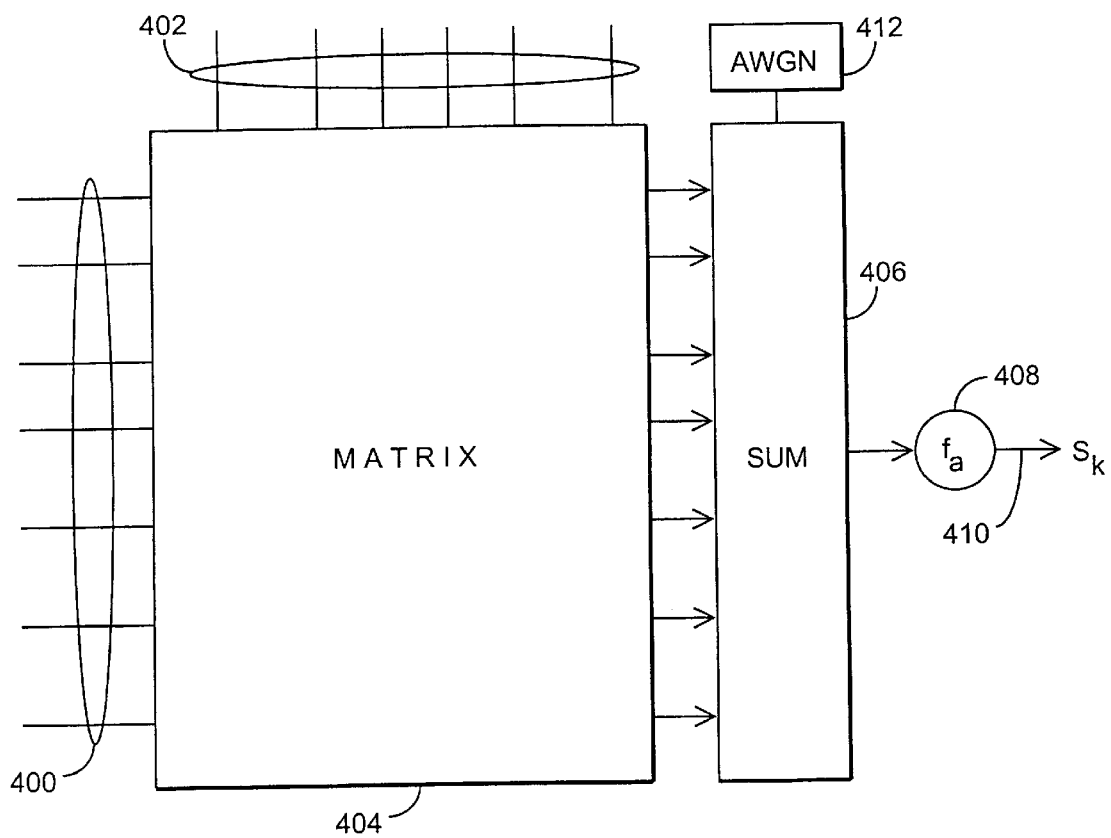
FIG. 4 illustrates an example of the implementation of the neural network neuron of the invention.

FIG. 4 illustrates the implementation of the neuron of the neural network according to the invention. The neuron state at the neuron output is $S_k$. Interfered code words to be decoded, typically composed of bits, and channel data are applied to the neuron as an input 400. The number of bits in each code word depends on the code rate of the code used. Further, feedback outputs of other neural network neurons are applied to the neuron as an input 402. In a preferred embodiment of the invention, the neuron does not comprise feedback to itself, i.e. the value $S_k$ is not applied to the neuron as an input, but feedback to itself is possible if necessary.

The inputs of the neuron are multiplied in a matrix 404. The matrix couplings are defined by the convolutional code and channel model used, and the formula corresponding to the couplings can be derived as illustrated in the above examples. The inputs can be multiplied with or without a change of sign. The multiplied signals are applied to a summer 406 where they are summed and the summed signal is further applied to a calculation means 408 which calculates the activation function and whose output $S_k$ 410 is the output value of the neuron. The calculation means 408 can be implemented by a gate array or a processor and software.

The function producing either a hard or a soft decision can thus be used as the activation function. If the result is a hard decision, the neuron outputs can have values −1 or 1. If the result is a soft decision, the neuron output can be a floating point number. Correspondingly, if the demodulator of the receiver produces soft bit decisions, floating point numbers are at the neuron input 400, and if the demodulator produces hard bit decisions, bits are at the neuron input 400. If both of the neuron inputs comprise bits, the multiplication between the inputs can be implemented in a simple manner by digital technology.

In one preferred embodiment of the invention, the neuron comprises a noise generator 412 and the generated noise is applied to a summer 406 where it is added to a sum signal. Variance of the noise to be generated reduces during the stabilization of the neural network, as described above. The noise can be Gaussian noise or binary noise. The binary noise is easier to implement, but on the other hand, a suitable number of Gaussian noise samples can be stored in a memory element and this noise can be reused. Noise generation can be implemented in manners know to the person skilled in the art.

Figure 5A:
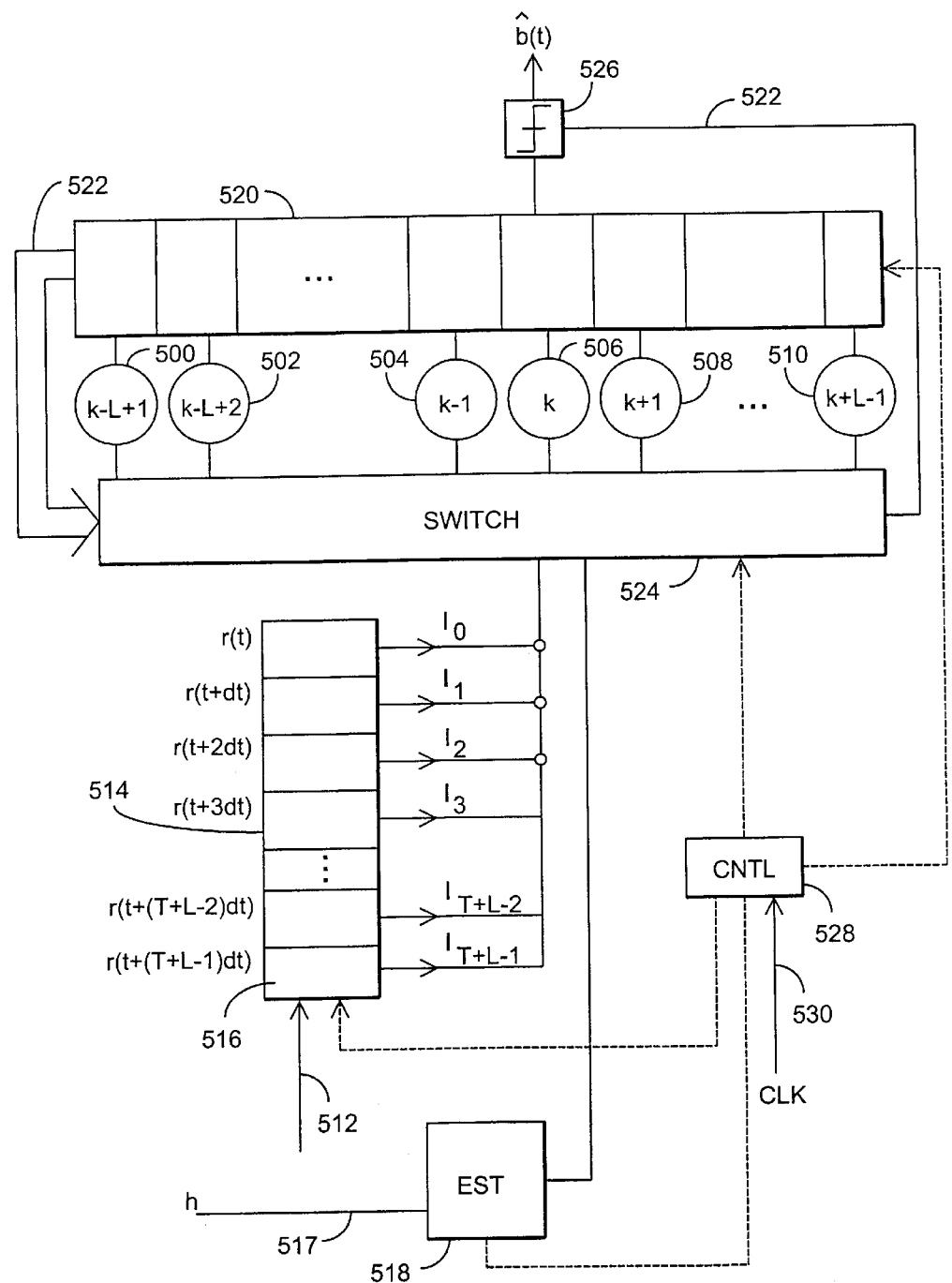
FIGS. 5a and 5b illustrate an implementation example of a neural network of the invention.

The structure of the decoder of the invention is studied next from the viewpoint of implementation. FIG. 5a illustrates the structure of the neural network of the invention. The neural network comprises a set of neurons 500 to 510, the implementation of which is described above. Code words 512 that are applied to a shift register 514 are applied to the neural network as an input. The latest T+L code words, where T is the decoding delay, are stored in the shift register. Upon completing the decoding of a code word, the decoded code word is deleted from the register, the code words in the register are shifted one step forward and a new code word is adopted in the last storage location 516 of the register. Operationally, the shift register is connected to the inputs of the neural network neurons 500 to 510. Channel data 517 from the channel estimation means is further applied to the neural network as an input. The channel data is applied to a buffer memory 518. The neural network further comprises a buffer memory 520 whose input comprises the outputs of the neurons 500 to 510 and whose buffer memory output is operationally connected to the inputs 724 of the neural network neurons. The number of the neurons depends on the characteristics of the convolutional code to be decoded.

The outputs of the neural network neurons are thus operationally connected to the buffer memory 520, from which the outputs are fed back 522 to the inputs 524 of the neurons. The neuron inputs comprise switching means 524 by which only the necessary code words and feedbacks are applied to each neuron, in accordance with a formula (as Formula (7) above) derived on the basis of the convolutional code to be decoded and the channel data. The switching means 524 can be implemented by means of a switching matrix or a discrete logic circuit. The bit to be decoded is obtained from the output of the calculation means 526 calculating the activation function. The calculation means 526 can be implemented by separate logic circuits or a processor and software.

The neural network decoder comprises a control unit 528, to which is applied a clock signal 530 as an input from the timing information regenerator of the receiver, as is described in connection with FIG. 1. The control unit takes care of the decoder timing, the control of the network stabilization time and controls the operation of decoding.

Figure 5B:
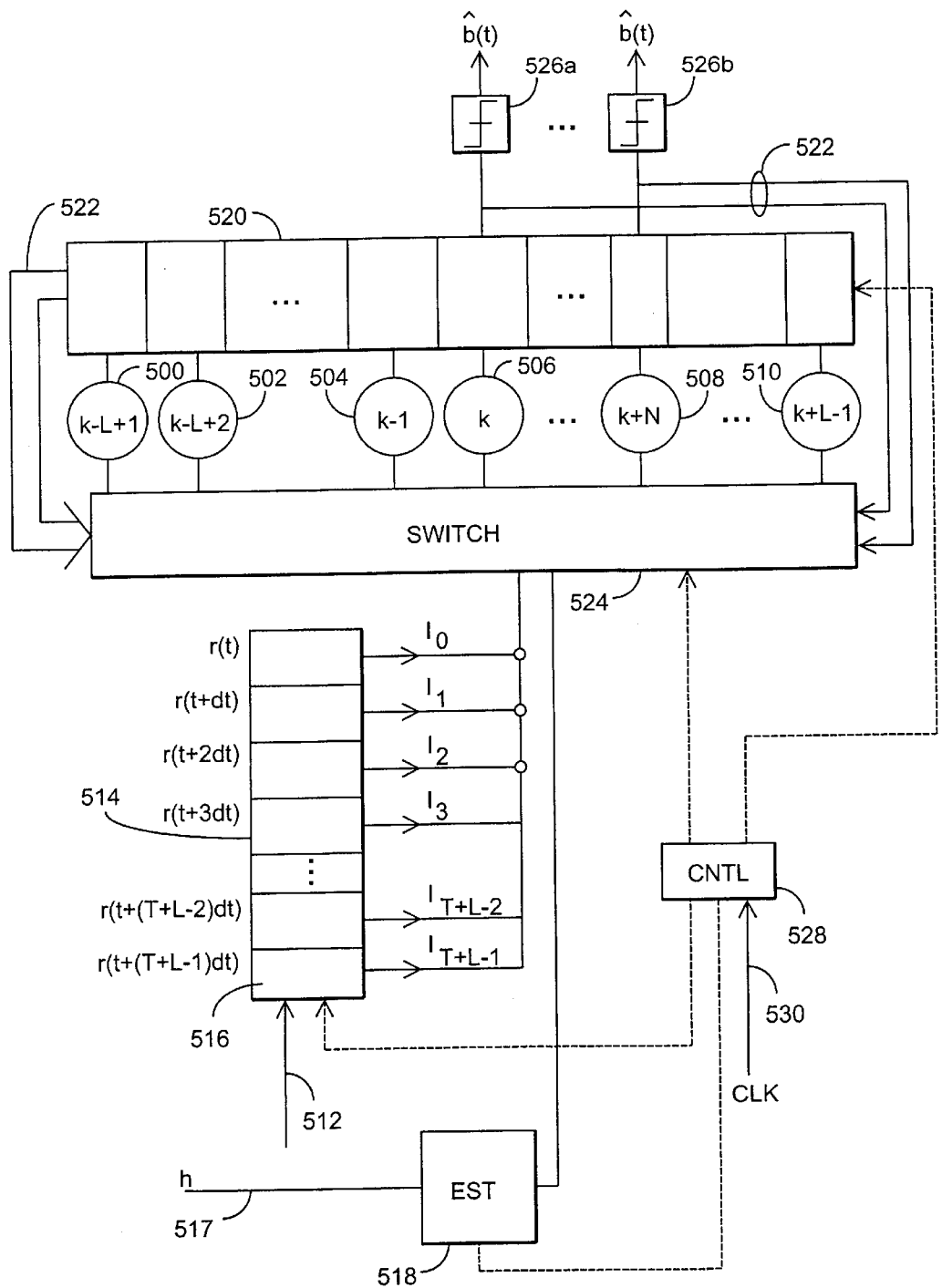

FIG. 5b illustrates a second preferred embodiment, in which several bit decisions of the adjacent neurons, i.e. neurons k . . . k+n, are extracted simultaneously from the neural network. In that case, the equipment comprises a plurality of calculation means 526a, 526b. Also in that case, upon completing the decoding of the code words, n decoded code words are deleted from the register, the code words in the shift register 514 are shifted a corresponding number n of steps forward and n new code words are adopted in the register.

Figure 6:
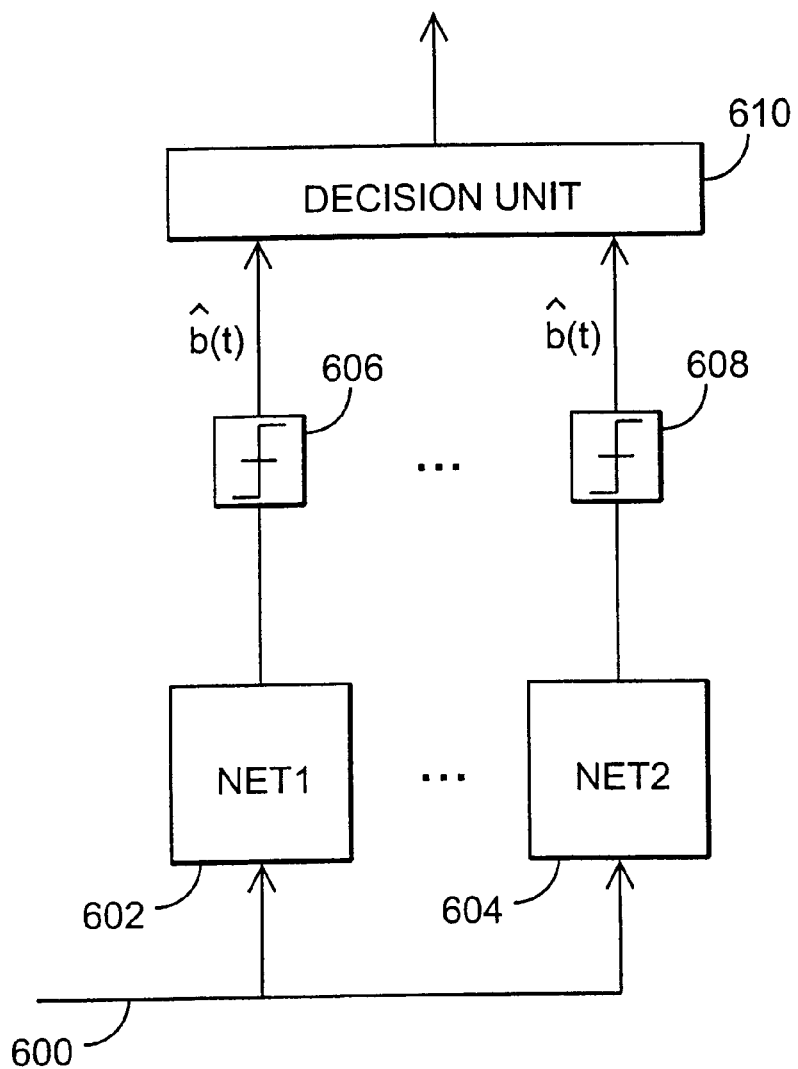
FIG. 6 illustrates an example where decoding is performed by means of a plurality of parallel neural networks.

FIG. 6 illustrates yet another embodiment of the invention, in which decoding is performed by means of a plurality of parallel neural networks. In that case the code words and the channel data 600 are applied to two or more neural networks 602, 604 arranged in parallel. The outputs of the calculation means 606, 608 of the neural networks are applied to a decision unit 610 where the best estimate for a decoded bit is selected from the outputs of the parallel neural networks. The decision unit can be advantageously implemented by means of separate logic circuits or a processor and software. The decision on the best estimate can be implemented in a variety of ways. For instance, from the outputs of the parallel neural networks, it is possible to select the value that occurs at most outputs to be a decoded bit. The decoded bit can also be re-encoded and from the outputs of the parallel neural networks the value that is found correct by re-encoding is selected to be the decoded bit. For the sake of clarity, re-encoding is not shown in the figure but it can be implemented in manners known to the person skilled in the art.

The decoder of the invention can be readily constructed by semiconductor technology, since the neurons of the neural network are very similar to one another in structure, only the input couplings vary. Consequently, to design and implement even a large network does not involve a great amount of work. Testing of the completed circuit is also simple to implement. The solution can also be advantageously implemented as a VLSI circuit, which makes it fast. It should also be noted that even though the structure of the decoder of the invention is simple and easy to implement, its performance is close to the theoretical maximum.

Even though the invention is described above with reference to the example of the accompanying drawings, it is obvious that the invention is not restricted thereto, but it can be modified in variety of ways within the scope of the inventive idea disclosed in the attached claims.

What is claimed is:

1. An arrangement for decoding and channel correcting a convolutionally encoded signal received over a transmission path, the signal comprising code words and the arrangement comprising a neural network which comprises a set of neurons which comprise a set of inputs and an output, received code words and at least some of the output signals of the neural network neurons being connected to the inputs of said neurons, the neurons comprising means for multiplying at least some of the neuron inputs prior to combining means and the arrangement comprising means for estimating the transmission channel, wherein estimated channel data is further connected to the inputs of the neurons and that a predetermined neuron is arranged to give an estimate of a channel-corrected and decoded symbol in its output signal, wherein the neuron comprises means for multiplying at least some of the neuron inputs and for changing the sign of the product prior to the combining means, the arrangement further comprising a shift register having the received code words as an input, and a memory element having the estimated channel data as an input, said shift register and memory element being operationally connected to the inputs of the neural network neurons, and a buffer memory having the outputs of the neurons as an input, the output of said buffer memory being operationally connected to the inputs of the neural network neurons.

2. An arrangement as claimed in claim 1, comprising means for conducting the received code word set to the shift register, the estimated channel data to the memory element, for setting initial values of the neurons and for conducting the estimate of the decoded symbol to the output of the network after the network has reached a stabilized state, for updating the code word set and the estimated channel data in the shift register and for repeating the above-described operation until the desired number of code words are decoded.

3. An arrangement as claimed in claim 1, wherein the neuron comprises means for adding noise to the result of combination in the combining means.

4. An arrangement as claimed in claim 1, wherein the output signal of a plurality of predetermined neurons comprises an estimate of the corresponding number of decoded and channel-corrected symbols.

5. A method for decoding a convolutionally encoded signal received over a transmission path, the signal comprising code words and the method comprising the steps of estimating a transmission channel, performing the decoding by means of an artificial neural network, the neural network comprising a set of neurons which comprise a set of inputs and an output, conducting the received code word set to the inputs of the neuron, multiplying at least some of the inputs of the neuron by one another, combining some of the inputs of the neuron after multiplication, feeding some of the output signals of the neural network neurons back to the inputs of each neuron, setting the initial values of the neurons and allowing the network to stabilize, wherein further the multiplication of the neuron inputs depends on the convolutional code used in signal encoding and the estimated channel and the estimate of the decoded and channel-corrected symbol is conducted from the output signal of a predetermined neuron to the output of the network after the network has reached the stabilized state, the code word set in the shift register is updated and the above-described four last steps are repeated until the desired number of code words are decoded.

6. A method as claimed in claim 5, wherein at least some of the neuron inputs are multiplied in the neuron and the sign of the product is changed prior to the combination.

7. A method as claimed in claim 5, wherein noise is added to the outcome of the combination in connection with combining the neuron inputs.

8. A method as claimed in claim 7, wherein noise is added such that the variance of the noise approaches zero as the network approaches stabilization.

9. A method as claimed in claim 5, wherein the network is allowed to stabilize for a predetermined period of time.

10. A method as claimed in claim 5, wherein the network is allowed to stabilize until the values of the output signals of the neurons do not vary.

11. A method as claimed in claim 5, wherein after combining the neuron inputs the signal is applied to an activation function, at the output of which the output signal of the neuron is obtained.

12. A method as claimed in claim 11, wherein from the combined signal the activation function makes a hard decision.

13. A method as claimed in claim 11, wherein from the combined signal the activation function makes a soft decision.

14. A method as claimed in claim 11, wherein the activation function is a step function.

15. A method as claimed in claim 5, wherein the received code word set is conducted to the neuron inputs by means of a shift register.

16. A method as claimed in claim 15, wherein the estimate of the decoded symbol is conducted from the output signal of a plurality of predetermined neurons to the output of the network after the network has reached the stabilized state and that the code word set in the shift register is updated with the same predetermined number of code words.

17. A method as claimed in claim 5, wherein the channel estimate is updated such that an estimate of each symbol is calculated by using a dedicated channel estimate.

18. A method as claimed in claim 5, wherein decoding is performed by means of a plurality of parallel neural networks and that from the outputs of the parallel neural networks the best estimate is selected to be a decoded bit.

19. A method as claimed in claim 18, wherein from the outputs of the parallel neural networks the value that occurs in most outputs is selected to be the decoded bit.

20. A method as claimed in claim 18, wherein from the outputs of the parallel neural networks the value that is found correct by re-encoding is selected to be the decoded bit.

* * * * *